United States Patent [19]

Goser

[11] 4,307,355
[45] Dec. 22, 1981

[54] METHOD AND CIRCUIT ARRANGEMENT FOR THE OPERATION OF RECURSIVE FILTER CIRCUITS OR ANALOG STORAGE CIRCUITS CONSTRUCTED ACCORDING TO THE CHARGE COUPLED DEVICE (CCD) PRINCIPLE

[75] Inventor: Karl Goser, Munich, Fed. Rep. of Germany

[73] Assignee: Siemens Aktiengesellschaft, Berlin & Munich, Fed. Rep. of Germany

[21] Appl. No.: 69,873

[22] Filed: Aug. 27, 1979

[30] Foreign Application Priority Data

Sep. 26, 1978 [DE] Fed. Rep. of Germany ....... 2841873

[51] Int. Cl.³ .................... H03H 17/04; H03H 21/00; G11C 27/00
[52] U.S. Cl. ............................... 333/165; 307/221 D; 307/523
[58] Field of Search ............................... 333/165–168, 333/173; 307/221 R, 221 C, 221 D, 295, 304, 522–526; 357/24; 364/825–827, 833, 862, 821

[56] References Cited

U.S. PATENT DOCUMENTS

| | | | |
|---|---|---|---|
| 3,947,698 | 3/1976 | Cheek, Jr. et al. | 307/221 D |
| 3,971,998 | 7/1976 | Gopinath et al. | 307/221 D X |
| 4,001,501 | 1/1977 | Weimer | 307/221 D X |
| 4,100,513 | 7/1978 | Weckler | 333/165 |
| 4,145,675 | 3/1979 | Picquendar | 328/167 X |

OTHER PUBLICATIONS

Bounden et al.–"MTI Filtering for Radar with Charge Transfer Devices".
Butler et al.–"Practical Considerations for Analog Operation of Bucket-Brigade Circuits", IEEE Journal of Solid-State Circuits, vol. SC-8, No. 2, Apr. 1973; pp, 157–168.
Smith et al.–"Active Bandpass Filtering with Bucket-Brigade Delay Lines", in IEEE Journal of Solid-State Circuits, vol. SC-7, No. 5, Oct. 1972; pp. 421–425.
Mavor et al.–"Techniques for Increasing the Effective Charge Transfer Efficiency of Tapped C.C.D. Registers" in Electronics Letters, Jan. 6, 1977, vol. 13, No. 1, pp. 31–33.

Primary Examiner—Marvin L. Nussbaum
Attorney, Agent, or Firm—Hill, Van Santen, Steadman, Chiara & Simpson

[57] ABSTRACT

The invention relates to a method for operating recursive filter circuits or analog storage circuits constructed according to the charge coupled device principle and relates to a circuit arrangement for implementing the method, in which method only each respective second stage of a CCD is occupied with a charge representing a sampling value of an analog signal and the respective stages lying between these stages concerned and left empty. Known circuits constructed according to the CCD principle conduct the signal from the output stage of a CCD chain to the input of the CCD loop via an amplifier to which the input signal is supplied at the same time. Thereby, the amplification must very precisely amount to one. An amplifier of the high stability required thereto which is arranged in common with the concerned CCD on a chip cannot be satisfactorily realized. By means of the invention, a method is specified in which the amplifier is replaced by means of modulation of a sampling value with a reference signal and by means of a charge amount corrected in accord with the result of the modulation.

11 Claims, 4 Drawing Figures

METHOD AND CIRCUIT ARRANGEMENT FOR THE OPERATION OF RECURSIVE FILTER CIRCUITS OR ANALOG STORAGE CIRCUITS CONSTRUCTED ACCORDING TO THE CHARGE COUPLED DEVICE (CCD) PRINCIPLE

BACKGROUND OF THE INVENTION

1. Field of the Invention

The invention relates to a method for operating recursive filter circuits or analog storage circuits constructed according to the charge coupled device (CCD) principle and to a circuit arrangement for implementation of the method in which only each respective second storage of a CCD is occupied with a charge representing a sampling value of an analog signal and the stages respectively lying between these stages concerned are left empty.

2. Prior Art

Know recursive filter circuits constructed according to the CCD principle conduct the signal from the output stage of a CCD chain to the input of the CCD loop via an amplifier to which the input signal is simultaneously supplied, c.f., for example, IEEE Journal of Solid State Circuits SC-7 (1972) October, pages 421 through 425; SC-8 (1973) April, page 157; Conference volume of the CCD 74, Edinburgh: "Signal Processing Application of Charge-Coupled-Devices" and "MTI Filtering for Radar with CCD"; 6th International Congress of Microelectronics: "Charge-Coupled-Devices". So that a good filter effect is achieved, the amplification must amount to 1 very precisely. Namely, given amplification that is too low, the quality of the filter would be too low, given amplification that is too high, self-oscillation would occur.

According to the present state of knowledge, an amplifier of the necessary high stability which is arranged in common on a chip with the CCD concerned cannot be satisfactorily realized.

It has been proposed that the critical amplifier be eliminated. To that end, it has been proven that, in principle, no amplifier is required in a CCD loop because the low transmission losses given CCD's allow one to expect a sufficiently high quality of the filter circuit. If one allows an information to circulate in a closed CCD loop, then the problems resulting from an amplifier of high stability are eliminated. However, such a CCD loop is not functional over a long time without additional devices, since the potential troughs of the individual stages become filled with charge carriers which derive from inverse currents and incomplete charge transfer. Therefore, it must be seen to, with an auxiliary circuit, that these parasitic charges are again removed and, thus, the operating point of the CCD loop is retained. The operating point is defined by the charge amount in the potential troughs in the idle state of the stages.

SUMMARY OF THE INVENTION

The object of the invention is to provide a method for the operation of a circuit of the said type and to specify a circuit arrangement for implementing the method, whereby the problems revealed above are to be solved in a simple manner and with low circuit outlay.

The said object is inventively achieved by means of a method for the operation of recursive filter circuits or analog storage circuits constructed according to the charge coupled device (CCD) principle in which only each respective second stage of a CCD is occupied with a charge representing sampling value of an analog signal and the stages lying between these stages concerned are left empty. The said method is characterized in that charges representing reference values of a reference signal are inserted between the charges representing the individual sampling values of a use signal; in that the amplitudes of the reference values are evaluated and in that, at each clock pulse, that charge part of the reference value concerned which represents an amplitude exceeding a predetermined threshold value is blanked out of the shift cycle and removed.

An inventive circuit arrangement for implementing this method is characterized in that at least one CCD loop is provided to which signals can be supplied at a first connection point via an input and an input signal amplifier and from which signals can be taken at a second connection point via an output signal amplifier and an output; in that an evaluator circuit is provided which is connected to the second connection point with an evaluator input; in that a gate circuit is provided which is connected to the second connection point with a use input and is connected to an evaluator output of the evaluator circuit with a control input; and in that one output of the gate circuit is applied to a reference potential, preferably zero potential.

The invention offers the advantage that all problems arising because of an amplifier present in the prior art are avoided and that filter circuits of high quality may be realized despite the lack of such an amplifier. Although the packing density of a filter circuit operated according to the inventive method is reduced in comparison to the packing density of traditional filter circuits, this state of affairs is not to be evaluated as being disadvantageous, since filter circuits of the said type usually only have relatively short CCD loops with a stage number between 10 and 40.

Further developments of the invention are characterized by features hereinafter to be described.

BRIEF DESCRIPTION OF THE DRAWINGS

In the following, the invention is described on the basis of Figures relating to a number of sample embodiments of the invention.

DESCRIPTION OF A PREFERRED EMBODIMENT

Figure 1:
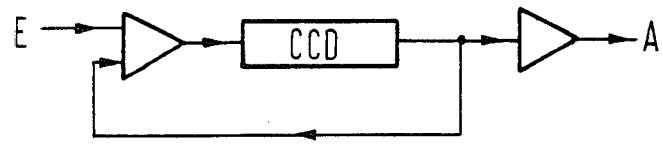
FIG. 1 shows the block diagram of a recursive filter circuit according to the prior art.
Figure 2:
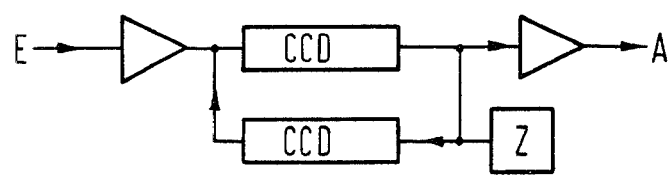
FIG. 2 shows the fundamental block diagram of a sample embodiment of the inventive circuit arrangement.
Figure 3:
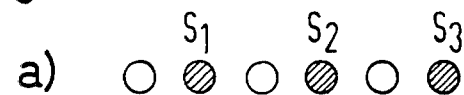
FIG. 3 shows, under (a) the charge movement pattern known from the prior art and, under (b) the inventive charge movement pattern.
Figure 3:
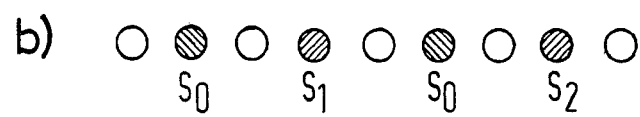
Figure 4:
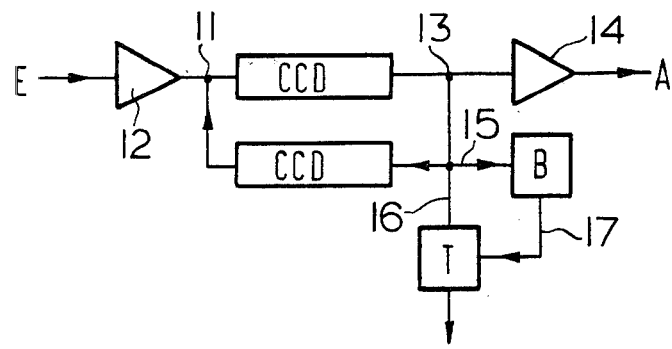
FIG. 4 shows the detailed block diagram of a preferred embodiment of the inventive circuit arrangement.

As already mentioned, FIG. 1 shows the block diagram of a recursive filter circuit according to the prior art. In such an arrangement, the problems initially cited occur because of the incorporation of an amplifier in the information loop. Inventively, cf. FIG. 2, where such an amplifier is eliminated. A closed CCD loop is provided to which signals can be supplied at a first connection point 11 via an input E and an input signal amplifier 12, and from which signals can be taken at a second connection point 13 via an output signal amplifier 14 and an output A. Moreover, there are provided an evaluator circuit B which is connected with an evaluator input 15 to the second connection point 13 and a gate circuit T which is connected with a use input to the second connection point 13 and with a control input to an evaluator output of the evaluator circuit B. One output of the gate circuit is applied to a reference potential, preferably zero potential. In FIG. 2, the evaluator circuit and the gate circuit are contained in a block symbolizing an auxiliary circuit Z. As already mentioned, FIG. 4 shows the detailed block diagram of a sample embodiment of the inventive circuit arrangement with the evaluator circuit B and the gate circuit T. As already mentioned, FIG. 3 shows, under (a) the charge movement pattern known from the prior art and, under (b) the inventive charge movement pattern. In contrast to the operating method known according to (a) in which spaces are inserted in the information flow between charges respectively representing the sampling values S1, S2, S3 . . . of an analog signal, charges representing reference values S0 of a reference signal are additionally inserted according to the invention in the manner illustrated between the charges representing the sampling values S1, S2 . . . . When an analog signal is transmitted via a CCD according to the charge movement pattern according to FIG. 3(a), then only every second stage is occupied with a charge. The stages respectively lying between remain empty. It is thereby achieved that the the individual charges do not mutually influence one another. Beyond that, for stabilizing the operating point, the reference values S0 of a reference signal are inventively inserted between the charges representing the individual sampling values S1, S2 . . . , which reference values S0 are characterized by means of semi-full potential troughs. The signal amplitudes characterizing the idle state of a stage and deriving from the reference values S0 are employed to stabilize the operating point of the CCD loop and to eliminate the influence of the inverse currents. This occurs according to FIG. 4 with the evaluator circuit B and the gate circuit T. The respective charges representing the reference values S0 are taken over by the evaluator circuit by means of a control mechanism not shown in greater detail. When the resulting signal amplitude exceeds a pre-determined threshold value, then the corresponding excess charge amount is removed via the gate circuit T, preferably to zero potential. Thereby, the idle level is automatically set in the CCD loop and the influence of the charge carriers supplied by the inverse currents is negated. What is advantageous in the inventive circuit arrangement is that parameter fluctuations do not influence the quality of the filter circuit, but rather only the operating point, and, thus, the volume range. The coupling-in of a preceding CCD loop can advantageously ensue in that a small part of the charge transported in the preceding CCD loop is branched off and is input after each respective fourth clock pulse into the CCD loop under consideration. The DC component is shifted because of the input signal in the CCD loop which, however, is immediately re-corrected via the regulating circuit consisting of the evaluator circuit B and gate circuit T. The coupling-out from the CCD loop can ensue in a similar manner. CCD circuits with gate electrodes (floating gate) lying at floating potential or diffusion areas (floating diffusion), for example, also come into consideration as the coupling stage.

The evaluator circuit B can be executed as a standard CCD output stage, whereby a so-called "floating gate amplifier" is particularly advantageous, since the charge in the CCD is not influenced and, thus, the charge transport in the CCD loop is not disturbed. Thereby, it is expedient to combine the output stage of the CCD and the evaluator circuit B in a single stage, whereby at a respective, specific point in time, a reference value S0 is relayed to the gate circuit T and, at a respectively different specific point in time, a signal proportional to the use signal is relayed to the next CCD loop. As a rule, the gate circuit T can be constructed similar to a CCD input stage in which the charge amount to be taken from the CCD loop is determined by the depth of a potential trough. Advantageously, given the arrangement of a plurality of CCD loops in a filter circuit, the same charge amount can be respectively removed from all stages concerned after the reading-out of the reference values S0. Moreover, it is also advantageous to remove charge carriers supplied by inverse currents to the stages left empty per se with the clock pulse concerned.

A simplified operating manner according to FIG. 3(a) is rendered possible in that the respective difference between a signal amplitude and the signal amplitude corresponding to that of an "empty" trough is formed and the signal gained in that manner is relayed. By so doing, the influence of the inverse currents can likewise be eliminated.

It will be apparent to those skilled in the art that many modifications and variations may be effected without departing from the spirit and scope of the novel concepts of the present invention.

I claim as my invention:

1. Method for operating recursive filter circuits having a first charge coupled device and a second charge coupled device (CCD) connected to feedback a signal from the output of the first device back to the input of the first device, each device having a plurality of storage stages which are connected to clock pulses for shifting charges from stage to stage in the charge coupled device, comprising the steps of: in the first CCD providing a sequence of charges such that a first stage of the CCD contains a sampling value of an analog signal, a second stage is left empty, a third stage contains a reference value charge of a reference signal, and the fourth stage is left empty, said pattern being repeated in successive stages of the first CCD; evaluating an amplitude of each of the reference charges as they occur at the output of the first CCD and, if the amplitude of the reference charge exceeds a predetermined threshold value, the excess charge is removed prior to feedback through the second CCD, whereby the influence of undesirable inverse currents on the operating point of the filter circuit is eliminated.

2. Method according to claim 1, in which the charges representing said reference values are dimensioned in such a manner that potential wells associated with the corresponding stages are only approximately half filled.

3. Method according to claim 1, in which given an arrangement of a plurality of CCD loops in a filter circuit, the same charge amount is removed from all stages concerned respectively after reading-out of the reference values.

4. Method according to claim 1, in which charge carriers supplied by inverse currents to the stages left empty per se are removed with the clock pulse concerned.

5. Circuit arrangement for implementing the method according to claim 1, in which at least one CCD loop is provided to which signals can be supplied at a first connection point via an input and an input signal amplifier and from which signals can be taken at a second connection point via an output signal amplifier and an output; in that an evaluator circuit is provided which is connected to said second connection point with an evaluator input; in that a gate circuit is provided which is connected to said second connection point with a use input and to an evaluator output of said evaluator circuit with a control input; and in that an output of said gate circuit is applied to a reference potential.

6. Circuit arrangement according to claim 5, in which said evaluator circuit is a CCD output stage known per se with an amplifier with floating gate.

7. Circuit arrangement according to claim 5, in which said gate circuit is executed in the manner of a CCD input stage known per se; and in that the excess charge amount to be removed is determined by the depth of the potential trough concerned.

8. Circuit arrangement according to claim 6, in which said CCD output stage influencing said second connection point of the CCD loop concerned and said evaluator circuit designed as a CCD output stage are combined in a single stage; and at a specific point in time said CCD output stage emitting a charge representing a reference value to said gate circuit and, at a different specific point in time, emitting a charge representing a sampling value of a use signal to the post-connected CCD loop.

9. Method for operating analog storage circuits having a first charge coupled device and a second charge coupled device connected to feedback a signal from the output of the first device back to the input of the first device, each device having a plurality of storage stages which are connected to clock pulses for shifting charges from stage to stage in the charge coupled device, comprising the steps of: in the first CCD providing a sequence of charges such that a first stage of the CCD contains a sampling value of an analog signal, a second stage is left empty, a third stage contains a reference value charge of a reference signal, and the fourth stage is left empty, said pattern being repeated in successive stages of the first CCD; evaluating an amplitude of each of the reference charges as they occur at the output of the first CCD and, if the amplitude of the reference charge exceeds a predetermined threshold value, the excess charge is removed prior to feedback through the second CCD, whereby the influence of undesirable inverse currents on the operating point of the analog storage circuit is eliminated.

10. Method according to claim 9, in which the charges representing said reference values are dimensioned in such a manner that potential wells associated with the corresponding stages are only approximately half filled.

11. Method according to claim 9, in which given an arrangement of a plurality of CCD loops in an analog storage circuit, the same charge amount is removed from all stages concerned respectively after reading-out of the reference values.

* * * * *